(12) United States Patent
Hashimoto et al.

(10) Patent No.: US 10,362,396 B2
(45) Date of Patent: Jul. 23, 2019

(54) PHASE CONTROL SIGNAL GENERATION DEVICE, PHASE CONTROL SIGNAL GENERATION METHOD, AND PHASE CONTROL SIGNAL GENERATION PROGRAM

(71) Applicant: Clarion Co., Ltd., Saitama (JP)

(72) Inventors: Takeshi Hashimoto, Motomiya (JP); Tetsuo Watanabe, Hasuda (JP); Hideyuki Morita, Saitama (JP); Takatomi Kumagai, Saitama (JP); Yasuhiro Fujita, Kashiwa (JP); Kazutomo Fukue, Kitamoto (JP)

(73) Assignee: CLARION CO., LTD., Saitama (JP)

( * ) Notice: Subject to any disclaimer, the term of this patent is extended or adjusted under 35 U.S.C. 154(b) by 0 days.

(21) Appl. No.: 15/551,752

(22) PCT Filed: Feb. 16, 2016

(86) PCT No.: PCT/JP2016/054366
§ 371 (c)(1),
(2) Date: Aug. 17, 2017

(87) PCT Pub. No.: WO2016/133061
PCT Pub. Date: Aug. 25, 2016

(65) Prior Publication Data
US 2018/0070177 A1    Mar. 8, 2018

(30) Foreign Application Priority Data

Feb. 19, 2015   (JP) ................................. 2015-030143

(51) Int. Cl.
*H04R 3/00*     (2006.01)
*H04R 3/04*     (2006.01)
(Continued)

(52) U.S. Cl.
CPC ............ *H04R 3/14* (2013.01); *H03H 17/0009* (2013.01); *H03H 17/0213* (2013.01); *H04R 3/00* (2013.01);
(Continued)

(58) Field of Classification Search
None
See application file for complete search history.

(56) References Cited

U.S. PATENT DOCUMENTS 8,358,790 B2    1/2013  Teramoto et al.
2010/0260356 A1  10/2010 Teramoto et al.
(Continued)

FOREIGN PATENT DOCUMENTS

JP    H07162985 A    6/1995
JP    2008283600 A   11/2008
(Continued)

OTHER PUBLICATIONS

International Preliminary Report on Patentability issued in Application No. PCT/JP2016/054366 dated Aug. 31, 2017 along with English translation.
(Continued)

*Primary Examiner* — Jesse A Elbin
*Assistant Examiner* — Kenny H Truong
(74) *Attorney, Agent, or Firm* — McCarter & English, LLP

(57) ABSTRACT

A phase control signal generation device generating a phase control signal for each of frequency bands for an audio signal converted into a frequency domain, the phase control signal generation device comprising: a setting change means that is able to change setting of a propagation delay time for each of predetermined frequency bands; a difference obtaining means that obtains a difference between propagation delay times before and after setting change; an updating
(Continued)

means that updates a phase control amount of the frequency band for which the propagation delay time is changed, based on the obtained difference; and a phase control signal generating means that generates a phase control signal of each frequency band by performing a smoothing process for the phase control amount in a frequency domain using the updated phase control amount.

17 Claims, 9 Drawing Sheets

(51) Int. Cl.
| | | |
|---|---|---|
| *H04R 3/14* | (2006.01) | |
| *H04S 1/00* | (2006.01) | |
| *H04S 3/00* | (2006.01) | |
| *H04S 5/02* | (2006.01) | |
| *H03H 17/00* | (2006.01) | |
| *H03H 17/02* | (2006.01) | |
| *H03H 17/08* | (2006.01) | |

(52) U.S. Cl.
CPC .............. *H04R 3/04* (2013.01); *H04S 1/00* (2013.01); *H04S 3/002* (2013.01); *H04S 5/02* (2013.01); *H03H 17/08* (2013.01); *H04R 2499/13* (2013.01); *H04S 2420/07* (2013.01)

(56) References Cited

U.S. PATENT DOCUMENTS

| | | | | |
|---|---|---|---|---|
| 2012/0243689 A1* | 9/2012 | Jeong | ................... | G06T 7/2053 |
| | | | | 381/17 |
| 2013/0329921 A1* | 12/2013 | Salsman | ................. | H04S 7/303 |
| | | | | 381/303 |
| 2014/0321680 A1* | 10/2014 | Takahashi | ............... | H04S 7/304 |
| | | | | 381/303 |
| 2016/0111139 A1* | 4/2016 | Choksey | ............. | G11C 11/4063 |
| | | | | 365/189.02 |
| 2016/0134985 A1 | 5/2016 | Hashimoto et al. | | |

FOREIGN PATENT DOCUMENTS

| | | |
|---|---|---|
| JP | 2015012366 A | 1/2015 |
| WO | 2009/095965 A1 | 8/2009 |

OTHER PUBLICATIONS

International Search Report of the International Searching Authority dated May 17, 2016, along with its English translation, issued in connection with International Application No. PCT/JP2016/054366 (4 pages).

Written Opinion of the International Searching Authority dated May 17, 2016, issued in connection with International Application No. PCT/JP2016/054366 (3 pages).

* cited by examiner

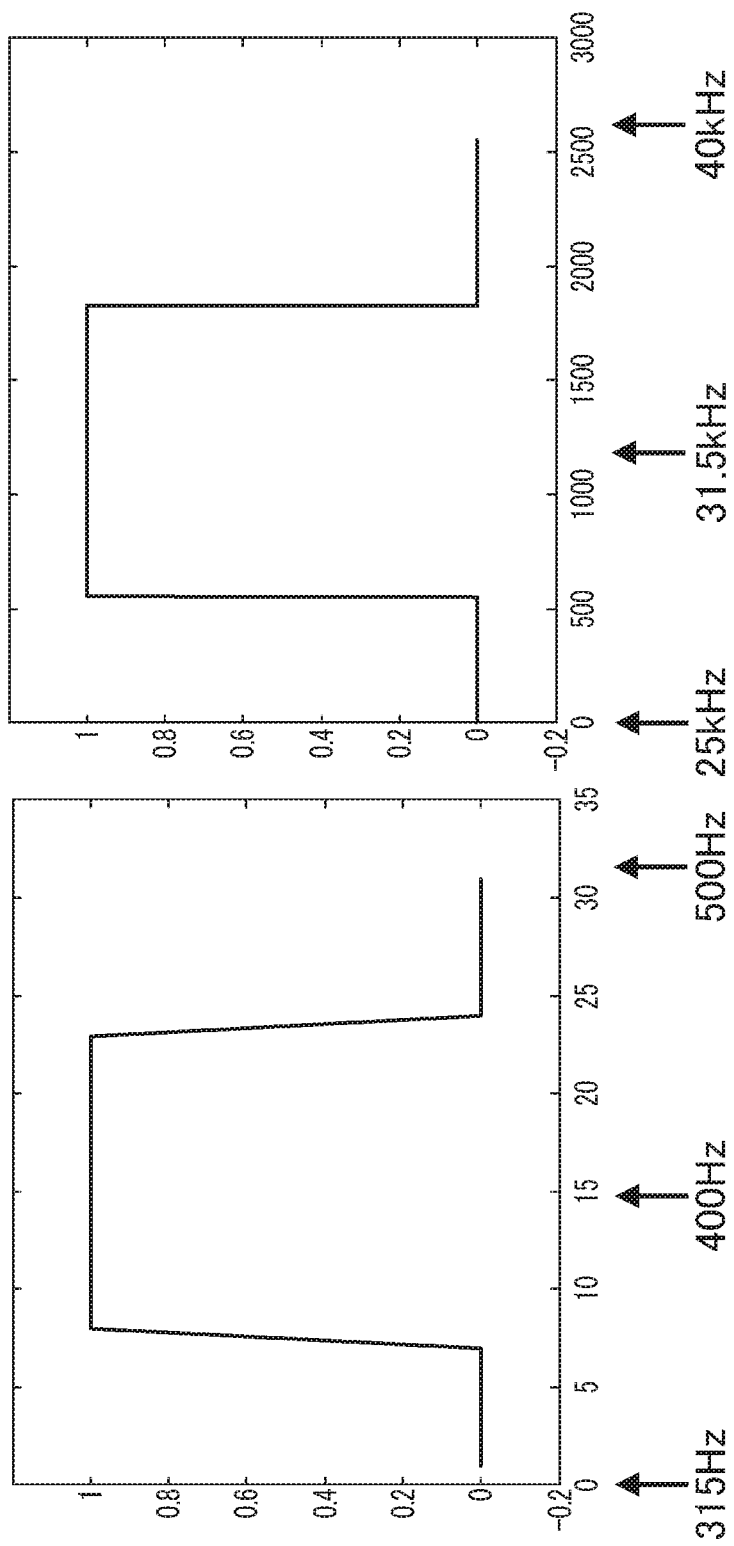

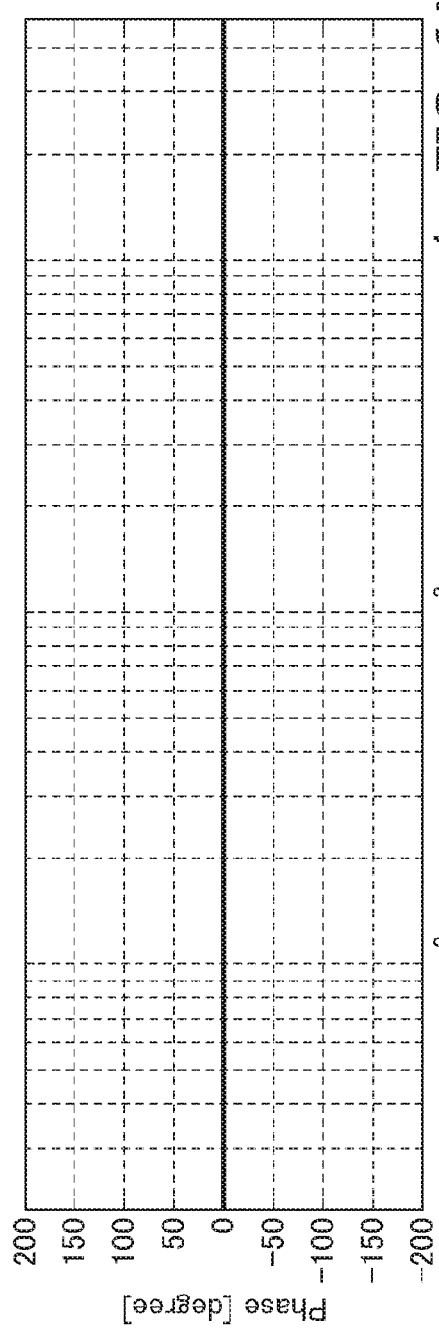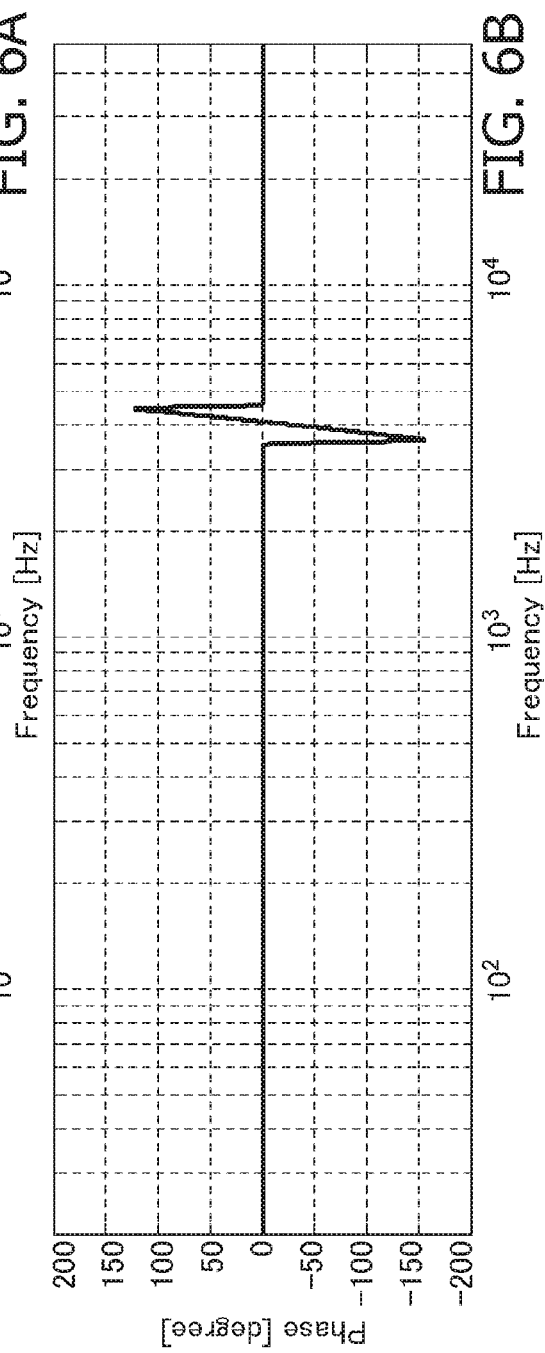

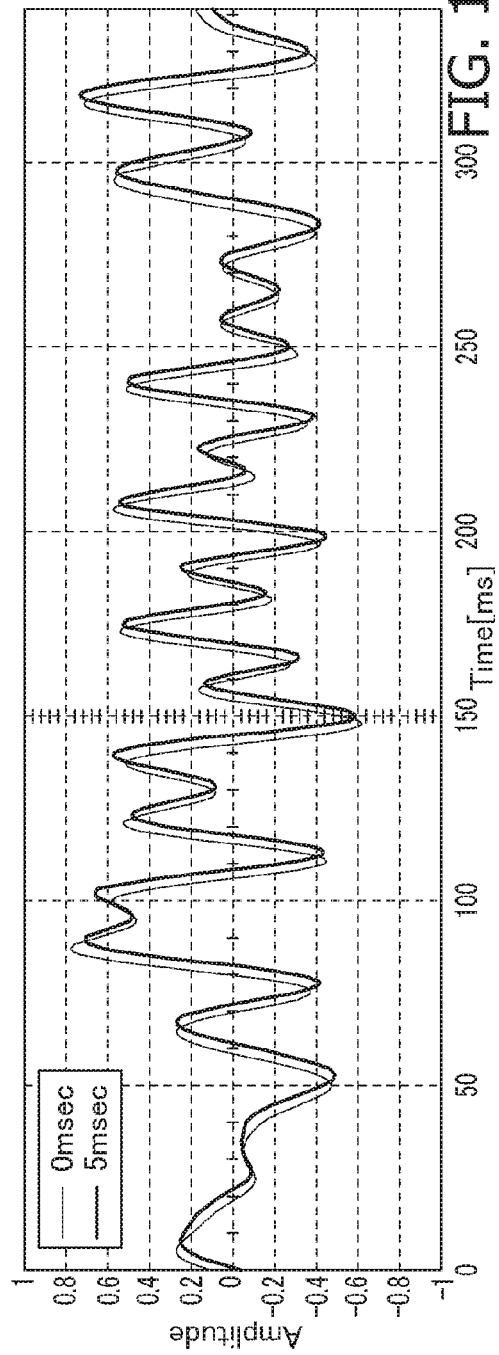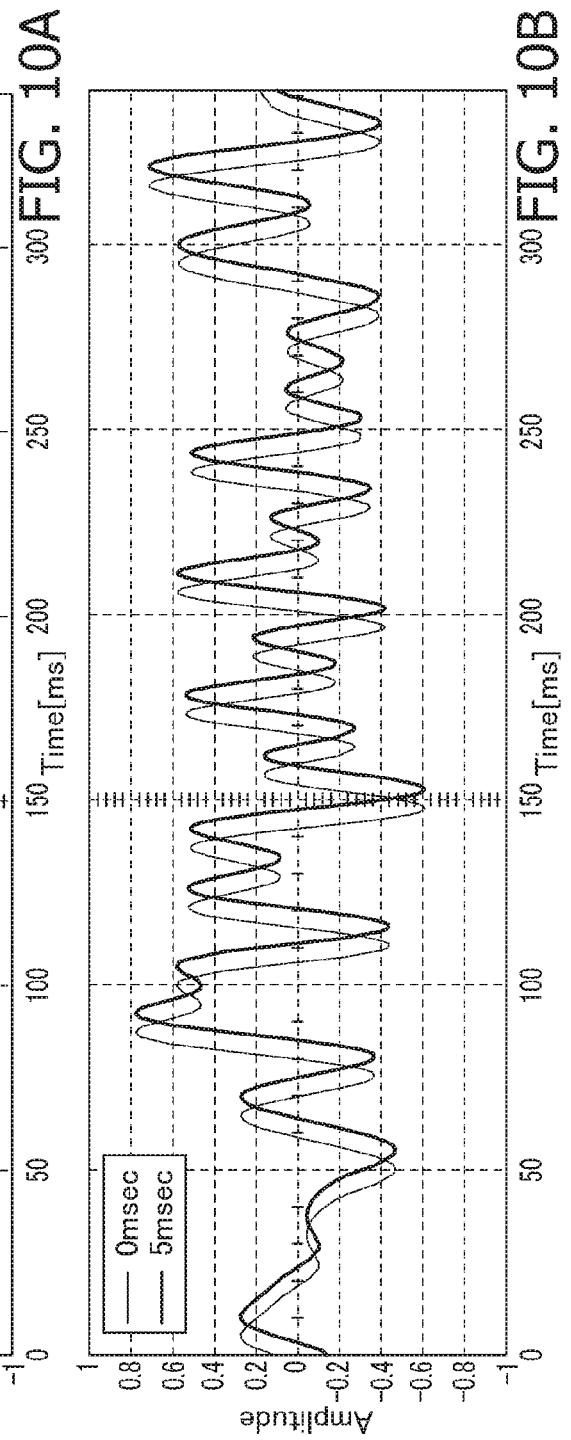

PHASE CONTROL SIGNAL GENERATION DEVICE, PHASE CONTROL SIGNAL GENERATION METHOD, AND PHASE CONTROL SIGNAL GENERATION PROGRAM

RELATED APPLICATIONS

This application is a U.S. National Phase Application under 35 U.S.C. 371 of International Application No. PCT/JP2016/054366 filed Feb. 16, 2016, which claims the benefit of Japanese Patent Application No. 2015-030143 filed on Feb. 19, 2015. The disclosures of these applications are incorporated herein by reference in their entireties.

TECHNICAL FIELD

The present invention relates to a phase control signal generation device, a phase control signal generation method and a phase control signal generation program that generate a phase control signal for executing a time alignment process to adjust propagation time delays of a plurality of frequency bands.

BACKGROUND ART

Generally, in a vehicle interior, speakers are provided at a plurality of positions. For example, a left front speaker and a right front speaker are provided at positions symmetrical to each other with respect to a central line of an in-vehicle space. However, if a listening position of a listener (a driver seat, a front passenger seat, a rear seat or the like) is considered as a reference position, these speakers are not positioned symmetrically. Therefore, due to differences in distances between the listening position of the listener and each of a plurality of speakers (difference in traveling time between playback sounds output from respective speakers), sound image localization bias by Haas effect occurs.

For example, Japanese Patent Provisional Publication No. H7-162985A (hereinafter, "patent document 1") discloses an apparatus that is capable of remedying the sound image localization bias. The apparatus disclosed in patent document 1 suppresses the sound image localization bias by adjusting time such that playback sounds emitted from all of the speakers reach the listener at the same time (i.e., a time alignment process). More specifically, the apparatus disclosed in patent document 1 corrects, over the entire range, the sound image localization bias and frequency characteristic disorders due to phase interferences by dividing an audio signal into a high range and a low range using a band dividing circuit and then adjusting time of each of playback sounds to be emitted from each of low band speakers and high band speakers.

However, the apparatus disclosed in patent document 1 has a problem that linearity of transmission characteristic at the listening position of the listener degrades due to loss of signals and double additions that occur in the band dividing circuit. Furthermore, the apparatus disclosed in patent document 1 also has a problem that peaks and/or dips occur in frequency characteristic around a crossover frequency when mixing the signals divided by the band dividing circuit.

In view of above, a brochure of International Patent Publication No. WO2009/095965A1 (hereinafter, "patent document 2") proposes an apparatus for performing a time alignment process that is capable of improving linearity of transmission characteristic at the listening position of the listener and suppressing occurrence of peaks and/or dips in frequency characteristic when mixing.

The apparatus disclosed in patent document 2 uses a digital filter to improve linearity of transmission characteristic at the listening position of the listener. More specifically, the apparatus disclosed in patent document 2 uses an FIR (Finite Impulse Response) filter. The FIR filter disclosed in patent document 2 is a high order filter having a steep cutoff frequency to suppress the occurrence of dips, and has a configuration which needs a plurality of delay circuits and multipliers. In particular, when constituting an FIR filter having a linear phase characteristic in which the phase is constant in all of the frequency bands, a plurality of delay circuits and multipliers are needed, and therefore a problem arises that a processing load increases. Further, the configuration described in the patent document 2 has a problem that as the number of divided frequency bands increases (as the frequency band for which time is adjusted becomes smaller), the required delay circuits and the multipliers further increase and thereby the processing load further increases.

Japanese Patent Provisional Publication No. 2015-12366A (hereafter, referred to as "patent document 3") describes an apparatus that executes a time alignment process for adjusting propagation delay times of a plurality of frequency bands. This apparatus is suitably configured to reduce the processing load while also reducing occurrence of dips. Specifically, the apparatus described in the patent document 3 generates a phase control signal relating to phase control (the phase rotation and the phase offset) for each of the frequency bands of an audio signal and smoothly connects the phase change between the frequency bands by executing a smoothing process for the generated phase control signal, so that occurrence of dips is reduced in a configuration not requiring many FIR filters (i.e., a configuration where the processing load is reduced).

SUMMARY OF THE INVENTION

However, there is a constant demand for reducing the processing load in an apparatus of the above described type. The object of the present invention is to provide a phase control signal generation device, a phase control signal generation method and a phase control signal generation program suitably configured to further suppress the processing load for generating a phase control signal for executing a time alignment process while suitably reducing occurrence of dips.

A phase control signal generation device according to an embodiment of the invention generates a phase control signal for each of frequency bands for an audio signal converted into a frequency domain. The phase control signal generation device comprising: a setting change means that is able to change setting of a propagation delay time for each of predetermined frequency bands; a difference obtaining means that obtains a difference between propagation delay times before and after setting change; an updating means that updates a phase control amount of the frequency band for which the propagation delay time is changed, based on the obtained difference; and a phase control signal generating means that generates a phase control signal of each frequency band by performing a smoothing process for the phase control amount in a frequency domain using the updated phase control amount.

An phase control signal generation device according to an embodiment of the invention may further comprise: a weighting coefficient storing means that stores a weighting coefficient for each of the frequency bands; and a weighting coefficient obtaining means that obtains, from the weighting coefficient storing means, the weighting coefficient corresponding to the frequency band for which the setting of the propagation delay time is changed by the setting change means. In this configuration, the updating means may update the phase control amount of the frequency band for which the propagation delay time is changed by the setting change means, based on the weighting coefficient obtained by the weighting coefficient obtaining means and the difference obtained by the difference obtaining means.

In an embodiment of the invention, the weighting coefficient obtained by the weighting coefficient obtaining means has, for example, a first value around a center frequency of the frequency band for which the propagation delay time is changed by the setting change means and has a second value smaller than the first value in a neighboring frequency band adjacent to the frequency band for which the propagation delay time is changed by the setting change means.

In an embodiment of the invention, for example, the weighting coefficient obtained by the weighting coefficient obtaining means is attenuated from the frequency band for which the propagation delay time is changed by the setting change means to the neighboring frequency band such that the weighting coefficient is changed from the first value to the second value using a rectangular attenuation curve.

In an embodiment of the invention, for example, the frequency band to be targeted for phase control has a band width which gets wider logarithmically from a low range to a high range.

The phase control signal generation device according to an embodiment of the invention may further comprise a filter coefficient storing means that stores a plurality of filter coefficients including a filter order and a cut-off frequency which are different between the frequency bands. In this configuration, the phase control signal generating means may perform the smoothing process using the filter coefficient which differs between the frequency bands.

In an embodiment of the invention, the filter order and the cut-off frequency may be set based on a number frequency spectral signals in the frequency band.

In an embodiment of the invention, the filter coefficient may be set such that as the frequency band becomes higher, a smoothing amount by the phase control signal generating means becomes greater.

A phase control signal generation method according to an embodiment of the invention is a method for generating a phase control signal for each of frequency bands for an audio signal converted into a frequency domain. The phase control signal generation method comprises: a setting change step of changing setting of a propagation delay time for each of predetermined frequency bands; a difference obtaining step of obtaining a difference between propagation delay times before and after setting change; an updating step of updating a phase control amount of the frequency band for which the propagation delay time is changed, based on the obtained difference; and a phase control signal generating step of generating a phase control signal of each frequency band by performing a smoothing process for the phase control amount in a frequency domain using the updated phase control amount.

A phase control signal generation program according to an embodiment of the invention is a program for causing a computer to execute a phase control signal generation method.

According to an embodiment of the invention, a phase control signal generation device, a phase control signal generation method and a phase control signal generation program suitably configured to further suppress the processing load for generating a phase control signal for executing a time alignment process while suitably reducing occurrence of dips.

BRIEF DESCRIPTION OF THE DRAWINGS

FIGS. 4A and 4B illustrate weighting coefficients referred to during execution of the phase control signal generating process according to the embodiment of the invention.

FIGS. 6A and 6B illustrate phase control signals after a phase smoothing process when a predetermined propagation delay time is set in the embodiment of the invention.

FIGS. 7A and 7B show output audio signals of the white noise of which the propagation delay times are set to predetermined propagation delay times.

FIGS. 10A-10B Regarding white noise of which an input audio signal is subjected to band limiting to a low range, FIGS. 10A and 10B show an output audio signal generated in the patent document 3 (FIG. 10A) and an output audio signal generated according to the embodiment (FIG. 10B).

EMBODIMENTS FOR CARRYING OUT THE INVENTION

Hereafter, an embodiment of the invention is described with reference to the accompanying drawings. In the following, an acoustic system is cited as an embodiment of the invention.

(Configuration of Acoustic System 1)

Figure 1:
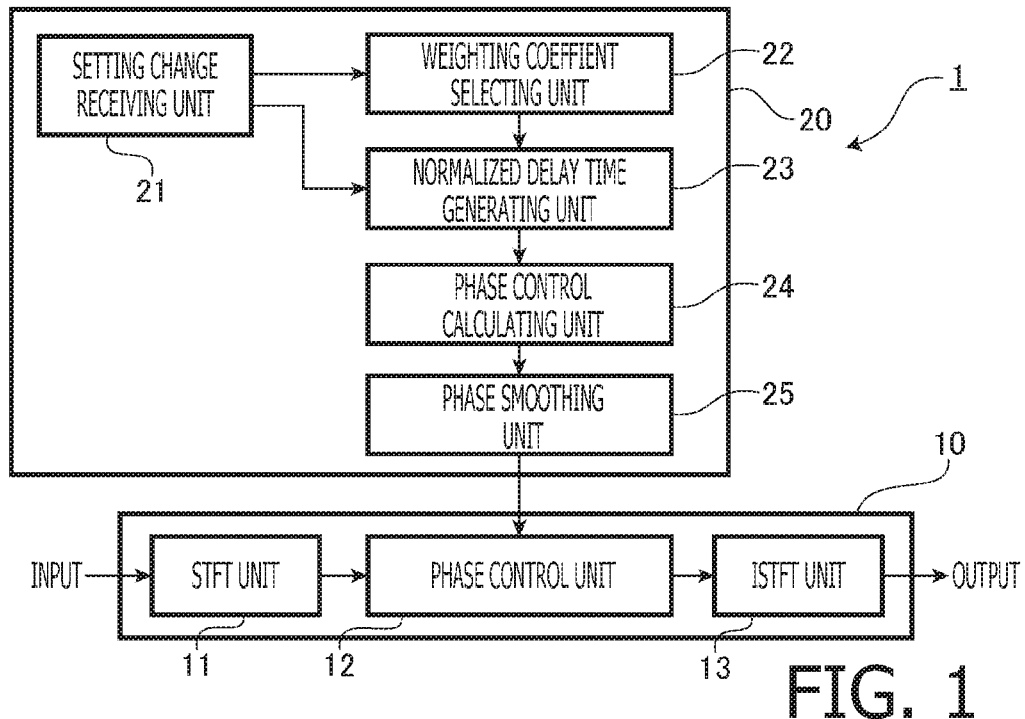
FIG. 1 is a block diagram illustrating a configuration of an acoustic system according to an embodiment of the invention.

FIG. 1 is a block diagram illustrating a configuration of an acoustic system 1 according to the embodiment of the invention. The acoustic system 1 according to the embodiment includes an audio device 10 and an information processing terminal 20.

The audio device 10 is, for example, an in-vehicle audio device mounted on an vehicle. As shown in FIG. 1, the audio device 10 includes a short-term Fourier transform unit (STFT) 11, a phase control unit 12 and an inverse short-term Fourier transform unit (ISTFT) 13. The audio device 10 adjusts a propagation delay time of an audio signal output from each speaker (not shown) disposed in a vehicle interior (i.e., the audio device 10 performs a time alignment process) in cooperation with the information processing terminal 20. Thus, an audio signal of which the propagation delay time is adjusted (corrected) is output from each speaker via a power amplifier. Therefore, a user is able to listen to music and the like in an environment where the sound image localization bias by Haas effect is suppressed.

To the STFT unit 11, an audio signal obtained by decoding an encoded signal in a reversible or nonreversible compressing format (e.g., an audio signal such as CD (Compact Disc) or DVD (Digital Versatile Disc)) is input from a sound source (not shown). The STFT unit 11 performs an overlapping process and weighting by use of a window function on the input audio signal, converts the weighted signal from the time domain to the frequency domain using STFT, and outputs real part and imaginary part frequency spectral signals to the phase control unit 12.

In this embodiment, to the STFT unit 11, an audio signal having a sampling frequency of 96 kHz is input. The STFT unit 11 has the Fourier transform length of 16,384 samples, the overlap length of 12,288 samples, and the window function being Hanning. The STFT unit 11 obtains the frequency spectrum signal of 16,384 points by performing STFT while shifting the time by 4,096 samples. In this embodiment, of the 16,384 samples, the frequency spectrum signal of 8,193 points corresponding a frequency range of up to Nyquist frequency is output to the phase control unit 12.

The phase control unit 12 controls (phase rotation and phase offset), for each of the frequency bands, the phase of the frequency spectral signal input from the STFT unit 11 based on the phase control signal (described in detail later) of each frequency band input from the information processing terminal 20. The phase control unit 12 outputs, to the ISTFT unit 13, the frequency spectral signal of which the phase has been controlled for each of the frequency bands.

The ISTFT unit 13 converts the frequency spectral signal input from the phase control unit 12 from the signal in the frequency domain to the signal in the time domain, and executes weighting by a window function and the overlapping addition for the converted signal. An audio signal obtained after the overlapping addition is a signal of which the propagation delay time has been corrected in accordance with the setting change (described in detail later) conducted using the information processing terminal 20, and is output to post stage circuit (a power amplifier, a speaker, etc.) from the ISTFT unit 13.

Figure 2:
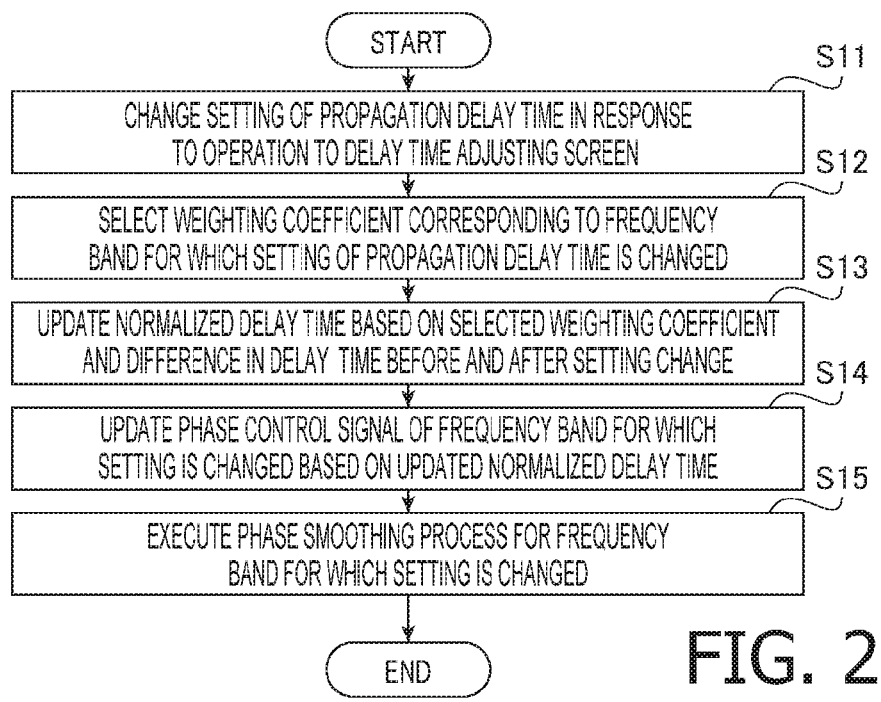
FIG. 2 is a flowchart illustrating a phase control signal generating process executed on an information processing terminal provided in the acoustic system according to the embodiment of the invention.

The information processing terminal 20 is, for example, a portable terminal, such as, a smartphone, a feature phone, a PHS (Personal Handy phone System), a tablet terminal, a notebook PC, a PDA (Personal Digital Assistant), a PND (Portable Navigation Device) and a portable game machine which can be taken onto an vehicle interior. As shown in FIG. 2, the information processing terminal 20 includes a setting change receiving unit 21, a weighting coefficient selecting unit 22, a normalized delay time generating unit 23, a phase control calculating unit 24 and a phase smoothing unit 25.

(Phase Control Signal Generating Process)

FIG. 2 is a flowchart illustrating a phase control signal generating process executed on the information processing terminal 20 according to the embodiment of the invention. When the information processing terminal 20 accepts a predetermined operation by a user, the information processing terminal 20 displays a delay time adjusting screen for adjusting the propagation delay time on a display screen.

Figure 3:
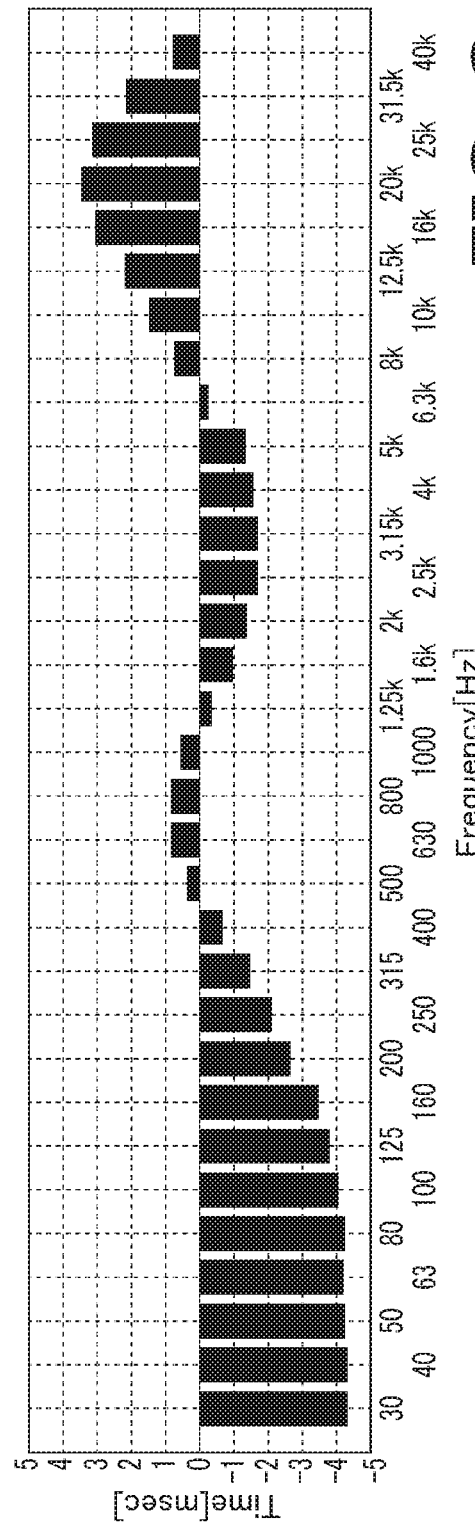
FIG. 3 shows a delay time adjusting screen displayed on a display screen of the information processing terminal according to the embodiment of the invention.

FIG. 3 shows an example of the delay time adjusting screen displayed on the display screen of the information processing terminal 20. As shown in FIG. 3, the delay time adjusting screen is an operation screen having the vertical axis representing the delay time (Time (unit; msec)) and the horizontal axis representing the frequency (unit: Hz), and the delay time adjusting screen is represented as a bar graph in which the propagation delay times of the respective frequency bands of the audio signal are arranged horizontally and are displayed graphically. It should be noted that the human listening characteristic is logarithmic with respect to the frequency. Therefore, the frequency of the horizontal axis is represented logarithmically in conformity with the human listening characteristic. Further, on the horizontal axis representing frequency, the range of 30 Hz to 40 kHz is divided into 32 sections by ⅓ octave. Therefore, in this embodiment, a target frequency band to be targeted for the phase control becomes logarithmically wider from the low range toward the high range. By displaying the delay time adjusting screen shown as an example in FIG. 3, the phase control signal generating process shown in FIG. 2 is started.

S11 in FIG. 2 (Setting Change of Propagation Delay Time)

A user is allowed to designate a frequency band which the user wants to change setting of the propagation delay time, and to input a delay amount, for example, by conducting a touching operation on the delay time adjusting screen displayed on the display screen of the information processing terminal 20. The settable change of the propagation delay time is, for example, the range of ±5 ms. On the delay time adjusting screen, user-assisting information for assisting the setting change operation for the propagation delay time may be displayed. As examples of the user-assisting information displayed on the delay time adjusting screen, a speaker name and its reproducible frequency of a speaker currently under the setting change, frequency information of a musical instrument and a vocal (e.g., an icon representing a music instrument playing a low-pitched sound is superimposed on a low range portion of the bar graph or an icon representing a music instrument playing a high-pitched sound is superimposed on a high range portion of the bar graph) can be cited.

When the setting change receiving unit 21 accepts a setting change operation, the setting change receiving unit 21 outputs information on the frequency band designated through the setting change operation to the weighting coefficient selecting unit 22, and outputs information on a propagation delay time designated by the setting change operation to the normalized delay time generating unit 23.

The setting change operation of the propagation delay time is not limited to a manual operation to the delay time setting screen, but may be conducted automatically. For example, a microphone is placed at a listening position (e.g., a driver seat, a front passenger seat, a rear seat or the like) of a listener. In this situation, an acoustic characteristic of a vehicle interior space is measured using the microphone placed at the listening position of the listener, and the setting change value of the propagation delay time is automatically calculated, for each of the frequency bands, based on the measurement result. The setting change receiving unit 21 outputs information on the calculated frequency band to the weighting coefficient selecting unit 22, and outputs information on the calculated propagation delay time to the normalized delay time generating unit 23.

(S12 in FIG. 2 (Selection of Weighting Coefficient))

The weighting coefficient selecting unit 22 stores, in a predetermined memory area, weighting coefficients which have been calculated in advance for the respective frequencies. When the information on the frequency designated through the setting change operation in step S11 (setting change of propagation delay time) is input from the setting change receiving unit 21, the weighting coefficient selecting unit 22 reads out, from the predetermined memory area, the weighting coefficient corresponding to the frequency band indicated by the information, and outputs the read information to the normalized delay time generating unit 23 together with the information on the frequency band.

FIGS. 4A and 4B illustrate, as examples, the weighting coefficients stored in the predetermined memory area. In each of FIGS. 4A and 4B, the vertical axis represents the weighting coefficient, and the horizontal axis represents the quantity of the phase control signals for each band updated by the phase control unit 12 of the audio device 10. The quantity of the phase control signals is "31" in the case of FIG. 4A and is "2560" in the case of FIG. 4B. As shown in each of FIGS. 4A and 4B, the weighting coefficient takes a value of 1 around the center frequency of the frequency band, and is reduced to zero using a rectangular attenuating curve so as not to affect the neighboring frequency band (so as not to substantially change the phase control amount in the neighboring frequency band). The weighting coefficient shown as an example in FIG. 4A has the center frequency band of 400 Hz, and the neighboring frequency bands are 315 Hz band and the 500 Hz band. The weighting coefficient shown as an example in FIG. 4B has the center frequency band of 31.5 kHz and the neighboring frequency bands are 25 kHz band and the 40 kHz band.

(S13 in FIG. 2 (Update of Normalized Delay Time))

For the frequency band designated by the setting change operation in step S11 (setting change of propagation delay time), the normalized delay time generating unit 23 calculates, as a difference delay time, a difference between the propagation delay time designated through the operation and the current delay time. The normalized delay time generating unit 23 multiplies together the calculated difference delay time and the weighting coefficient input from the weighting coefficient selecting unit 22, adds the multiplied value to the current delay time, and, to control only the propagation delay time while maintaining the phase in the frequency band, further performs conversion so that the resolution of the propagation delay time becomes the inverse of the sampling frequency. As a result, the normalized delay time of each frequency band is updated (more specifically, only the normalized delay time of the frequency band designated through the setting change operation in step S11 (setting change of propagation delay time) is changed with respect to the current value).

(S14 in FIG. 2 (Update of Phase Control Signal))

The phase control calculating unit 24 updates the phase control amount for each frequency band (more specifically, changes only the phase control amount of the frequency band designated by the setting change operation with respect to the current value) by multiplying together the updated normalized delay time and the corresponding frequency (the frequency contained in the frequency band designated through the setting change operation in step S11 (setting change of propagation delay time)), and outputs the updated phase control amount to the phase smoothing unit 25 as an updated phase control signal. The term phase control as used herein means control of the rotating amount of the phase of a frequency spectral signal. Control of the rotating amount of the phase is equivalent to control of the propagation delay time in the time domain. Further, the phase offset corresponding to the frequency is applied to the phase rotating amount of each frequency band.

In the patent document 3, when setting of a propagation delay time is changed for a part of the frequency bands, a phase control signal is regenerated for all the frequency bands. By contrast, in this embodiment, only the phase control signal of the frequency band for which the setting is changed is regenerated (updated). Therefore, according to the embodiment, the processing load for generating the phase control signal is further reduced.

(S15 in FIG. 2 (Phase Smoothing))

The phase smoothing unit 25 smoothes the phase control signal input from the phase control calculating unit 24 for the frequency band designated by the setting change operation in step S11 (setting change of propagation delay time) through an integrating process using an FIR low pass filter. As a result, change of the phase between the frequency bands having different delay times is smoothed, and frequency characteristic disorders (occurrence of dips) due to frequency interference between the frequency bands is suppressed. The phase smoothing unit 25 outputs, to the phase control unit 12, the phase control signal of which the frequency characteristic disorders are suppressed.

In the patent document 3, when setting of the propagation delay time of a part of the frequency bands is changed, the phase smoothing process is performed for all the frequency bands. By contrast, in this embodiment, the phase smoothing process is performed only for the frequency band for which the setting is changed. In this point of view, the processing load for generating the phase control signal can also be suppressed.

Let us consider, for example, a case where all the frequency bands from the low range to the high range is divided into sections by the ⅓ octave. In this case, in a low range lower than or equal to several hundred Hz where the number (the point number) of the frequency spectral signals per a frequency band is relatively small, the smoothing amount by the integrating process becomes larger relative to a high range. Therefore, in the low range, the difference between the phase control signal before the phase smoothing process and the phase control signal after the phase smoothing process becomes large.

For this reason, in this embodiment, filer coefficients of the FIR low pass filter are calculated in advance for each of the frequency bands, and are stored in the predetermined memory area. The filter coefficients are set such that the filter orders and cut-off frequencies of the respective frequency bands are different from each other. The phase smoothing unit 25 reads out the filter coefficients from the predetermined memory area, and executes the smoothing process for the phase control signal by the integrating process.

The following is the filter order and the normalized cut-off frequency for the point number P (the number of frequency spectral signals in the frequency band).

Point number P<20
Filter order: none
Normalized cut-off frequency: none
20≤Point number P<40
Filter order: 4
Normalized cut-off frequency: ¼
40≤Point number P<80
Filter order: 8
Normalized cut-off frequency: ⅛
80≤Point number P<160
Filter order: 16

Normalized cut-off frequency: 1/16
160≤Point number P
Filter order: 32
Normalized cut-off frequency: 1/32

In the above described example, in the frequency band in which the point number P is smaller than 20, the smoothing process is not performed. In the frequency band in which the point number P is larger than or equal to 20, the filter order is set to be longer and the normalized cut-off frequency is set to be smaller so that, as the point number P becomes larger, the smoothing amount becomes greater. In the frequency band in which the pint number P is larger than or equal to 160, the filer order and the cut-off frequency are set to fixed values so that the smoothing amount is maintained. For example, the frequency band in which the point number P is smaller than 20 corresponds to the frequency smaller than 250 Hz. The frequency band in which the point number P is larger than or equal to 160 corresponds to the frequency band of larger than or equal to 2.5 kHz.

Figure 5B:
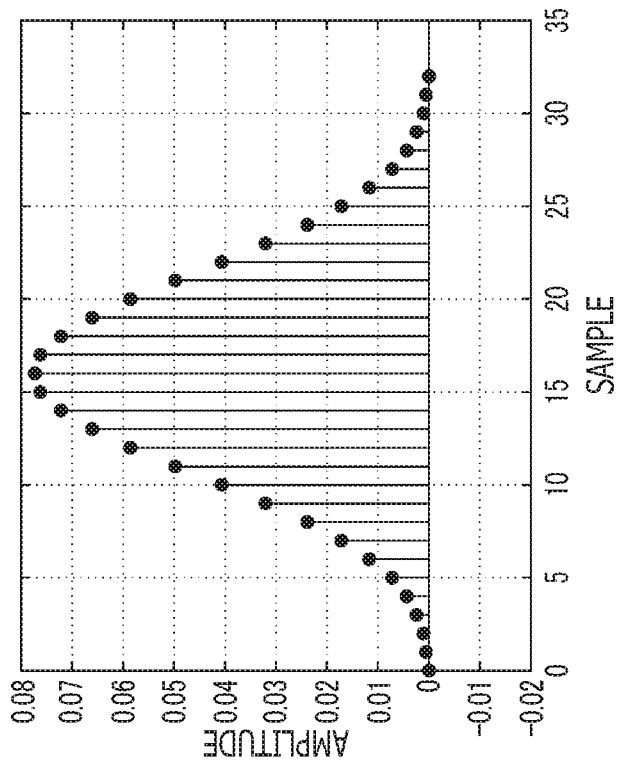
FIGS. 5A and 5B illustrate filter coefficients referred to during execution of the phase control signal generating process according to the embodiment of the invention.
Figure 5A:
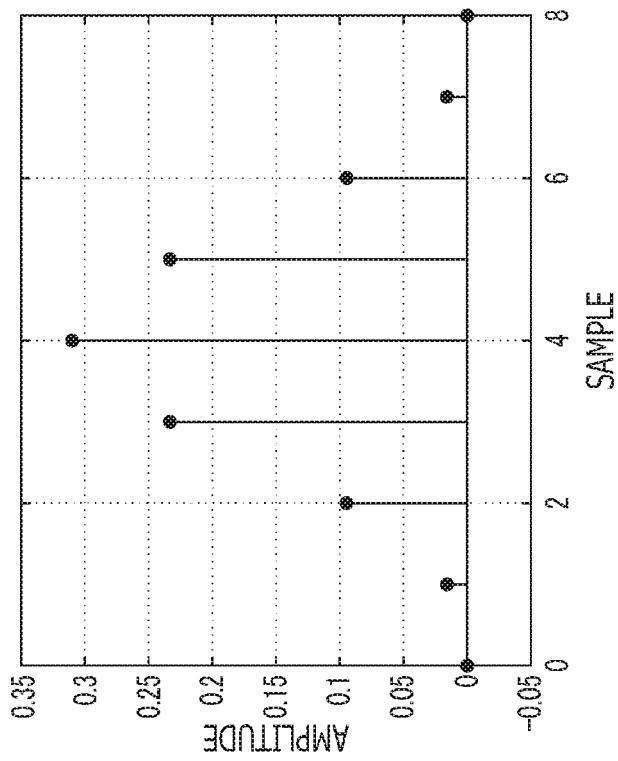

As examples, FIG. 5A illustrates filter coefficients corresponding to the frequency band where the point number P is larger than or equal to 40 and is smaller than 80, and FIG. 5B illustrates filter coefficients corresponding to the frequency band where the point number P is larger than or equal to 160. In each of FIGS. 5A and 5B, the vertical axis represents the amplitude and the horizontal axis represents the sample number (the filter order).

As described above, in this embodiment, the optimum filter coefficients are provided for each of the frequency bands. Therefore, the phase control signal is smoothed by the optimum amount corresponding to the number of frequency spectral signals in the frequency band. As a result, accuracy of setting of the delay time is enhanced in the low range, and dips caused by interference between the bands can be reduced while maintaining the accuracy of setting of the delay time in the middle and high range.

More Detailed Example

Figure 7A:
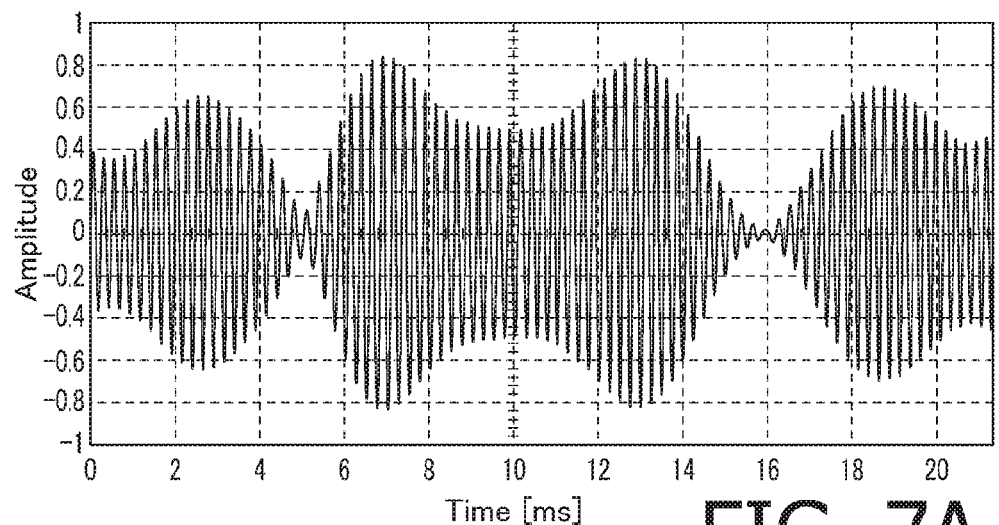
FIGS. 7A-7B Regarding white noise of which an input audio signal is subjected to band limiting.
Figure 7B:
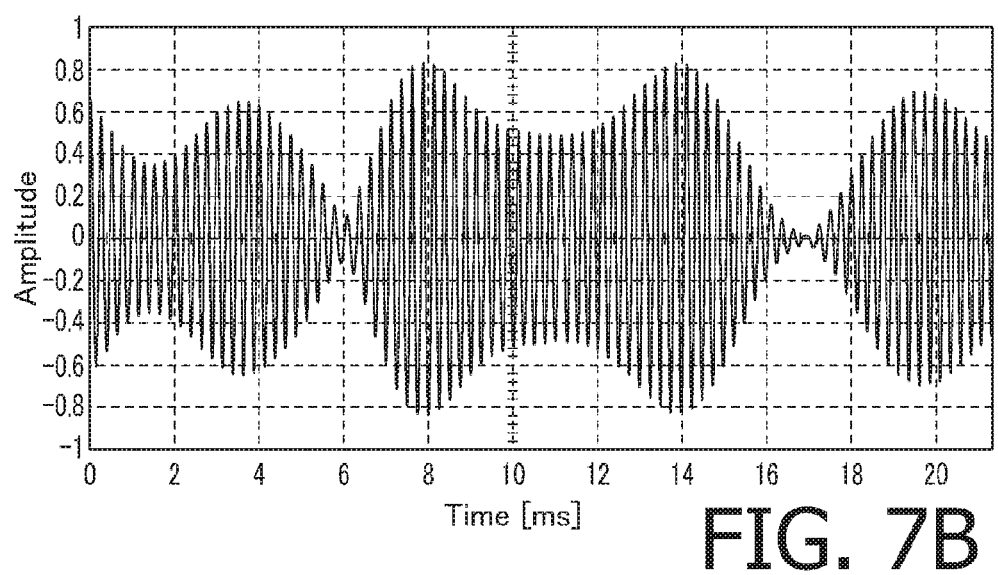

FIG. 6A shows, as an example, the phase control signal after the phase smoothing process when the propagation delay time of the 4 khz band is set to 0 msec (i.e., no propagation delay time is set) in the delay time adjusting screen shown in FIG. 3. FIG. 6B shows, as an example, the phase control signal after the phase smoothing process when the propagation delay time of the 4 khz band is set to 1 msec in the delay time adjusting screen shown in FIG. 3. In each of FIGS. 6A and 6B, the vertical axis represents the phase (unit: degree), and the horizontal axis represents the frequency (unit: Hz). Regarding white noise of which the input audio signal is subjected to band limiting at the 4 kHz band, FIGS. 7A and 7B show output audio signals of the white noise of which the propagation delay times are set to 0 msec and 1 msec, respectively. In each of FIGS. 7A and 7B, the vertical axis represents the amplitude (Amplitude) and the horizontal axis represents the time (Time (unit: msec)). The phase control signal is limited such that the phase angle is within ±180 degrees.

By referring to FIGS. 6A-6B and 7A-7B, it is understood that the output audio signal is delayed in accordance with the propagation delay time set through the delay time setting screen.

Figure 8A:
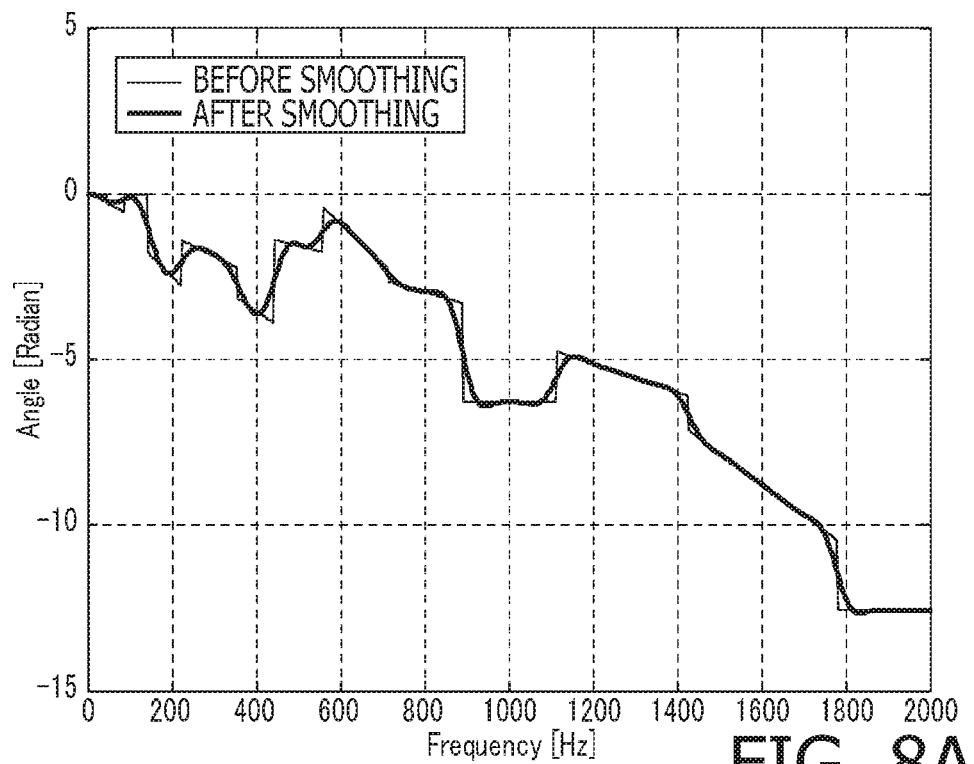
FIGS. 8A and 8B show the phase control signal before and after the phase smoothing process in the patent document 3 (FIG. 8A), and the phase control signals before and after the phase smoothing process in the embodiment (FIG. 8B).
Figure 8B:
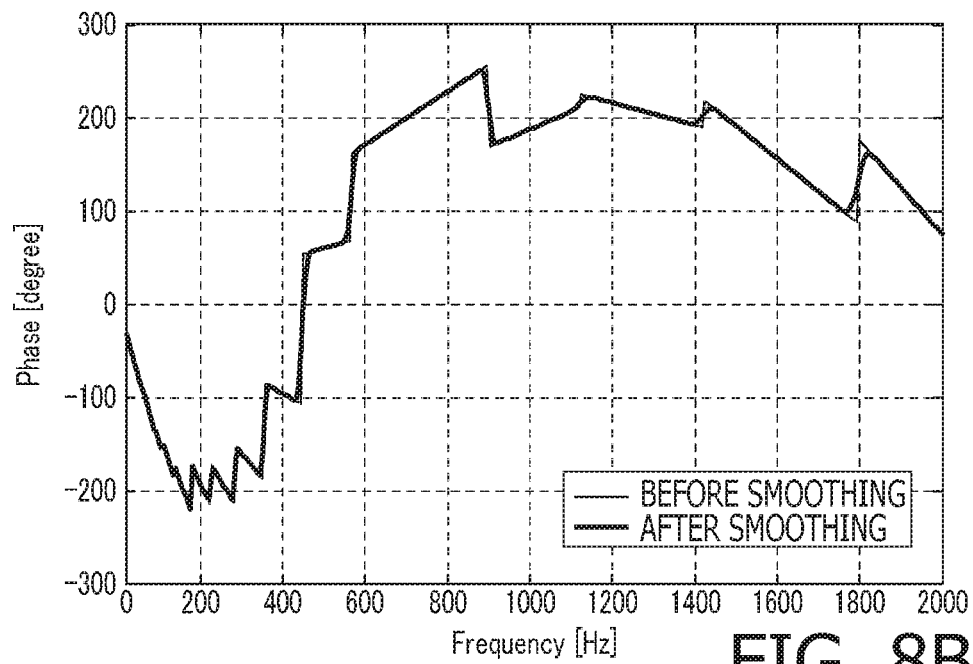

FIG. 8A shows the phase control signals before and after the phase smoothing process in the patent document 3, and FIG. 8B shows the phase control signals before and after the phase smoothing process in the embodiment. In each of FIGS. 8A and 8B, the vertical axis represents the phase (Phase (unit: degree)), and the horizontal axis represents the frequency (Frequency (unit: Hz)). In each of FIGS. 8A and 8B, a thin solid line represents the phase control signal before the phase smoothing process, and a thick solid line represents the phase control signal after the phase smoothing process.

Since, in the patent document 3, the phase smoothing process is executed the same filter coefficients over the all frequency bands, the smoothing amount by the integrating process becomes relatively larger at a lower range where the point number P is small. As a result, as shown in FIG. 8A, the difference is caused between the phase control signals before and after the phase smoothing process (in particular, in a low range smaller than or equal to several hundreds Hz). By contrast, according to the embodiment, since the optimum filter coefficients are applied to each of the frequency bands, the phase control signal is smoothed by an optimum amount corresponding to the number of frequency spectral signals in the frequency band. As a result, as shown in FIG. 8B, almost no difference is caused between the phase control signals before and after the phase smoothing process even in the low range smaller than or equal several hundreds Hz where the point number P is small. Thus, it is understood that the phase control signal is improved with respect to the patent document 3.

Figure 9A:
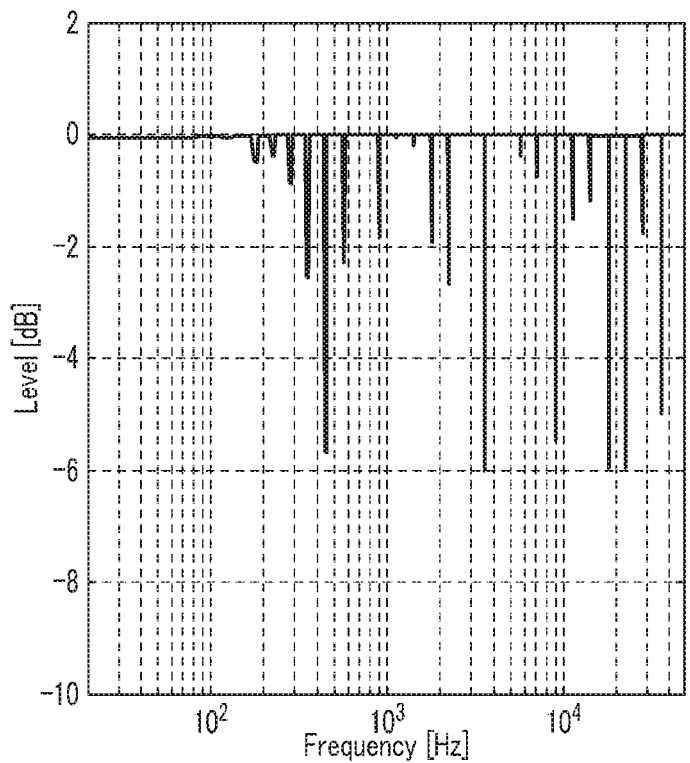
FIGS. 9A and 9B show frequency characteristics of output audio signals when an impulse signal having a flat frequency characteristic is input, and show a frequency characteristic of an output audio signal when the phase smoothing process according to the embodiment is not performed (FIG. 9A) and a frequency characteristic of an output audio signal when the phase smoothing process according to the embodiment is performed (FIG. 9B).
Figure 9B:
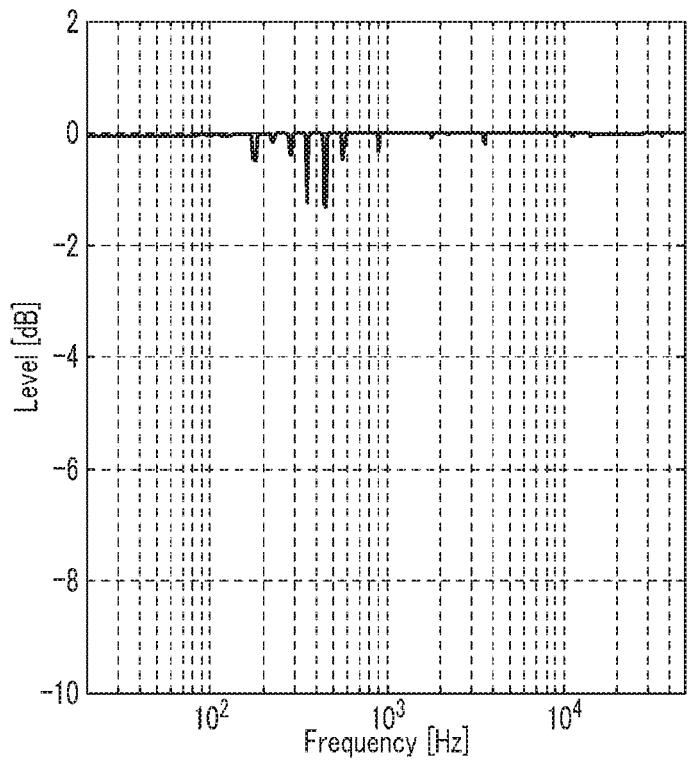

FIGS. 9A and 9B show, as examples, frequency characteristics of output audio signals when an impulse signal having a flat frequency characteristic is input. FIG. 9A shows a frequency characteristic of an output audio signal when the phase smoothing process according to the embodiment is not performed. FIG. 9B shows a frequency characteristic of an output audio signal when the phase smoothing process according to the embodiment is performed. In each of FIGS. 9A and 9B, the vertical axis represents the signal level (Level (unit; dB)), and the horizontal axis represents the frequency (Frequency (unit: Hz)).

From the comparison between FIG. 9A and FIG. 9B, it is understood that, through the phase smoothing process, dips are considerably reduced over the all frequency bands, and the interference between the frequency bands are reduced while maintaining the setting accuracy of the propagation delay time.

Regarding low range white noise of which an input audio signal is subjected to band limiting within the range of 0 Hz to 63 Hz, FIG. 10A shows, as an example, an output audio signal generated in the patent document 3, and FIG. 10B shows, as an example, an output audio signal generated according to the embodiment. In each of FIGS. 10A and 10B, a thin solid line represents the output audio signal when the propagation delay time is set to 0 msec, and a thick solid line represents the output audio signal when the propagation delay time is set to 5 msec. In each of FIGS. 10A and 10B, the vertical axis represents the amplitude (Amplitude) and the horizontal axis represents the time (Time (unit: msec)).

It is understood, according to the embodiment, the output audio signal is delayed in accordance with the propagation delay time for which the setting is changed while maintaining the amplitude (see FIG. 10B), and the output audio signal is improved with respect to the patent document 3 (see FIG. 10A).

The foregoing is the explanation about the embodiment of the invention. The invention is not limited to the above described embodiment, but can be varied in various ways within the scope of the invention. For example, embodiments of the invention include a combination of embodiments explicitly described in this specification and embodiments easily realized from the above described embodiment.

For example, in the above described embodiment, various components constituting the acoustic system 1 are separately provided for the audio device 10 and the information processing terminal 20; however, the present invention is not limited to such an example. In another embodiment, all the various components constituting the acoustic system 1 may be provided in the audio device 10 or all the various components constituting the acoustic system 1 may be provided in the information processing terminal 20.

In the above described embodiment, only for the frequency band designated by the setting change operation in step S11 (setting change of propagation delay time), the phase smoothing process using the corresponding filter order and the normalized cut-off frequency us performed; however the invention is not limited to such an example. In another example, the phase smoothing process using the corresponding filter order and the normalized cut-off frequency may be performed not only for the frequency band designated by the setting change operation but also for all the frequency bands.

What is claimed is:

1. A phase control signal generation device generating a phase control signal for each of frequency bands for an audio signal converted into a frequency domain, the phase control signal generation device comprising:
    a non-transitory storage medium storing instructions thereon; and
    a processor coupled to the non-transitory storage medium and configured to execute the instructions stored thereon, which, when executed by the processor configure the processor to
        change setting of a propagation delay time for each of predetermined frequency bands;
        obtain a difference between propagation delay times before and after setting change;
        update a phase control amount of the frequency band for which the propagation delay time is changed, based on the obtained difference; and
        generate a phase control signal of each frequency band by performing a smoothing process for the phase control amount in a frequency domain using the updated phase control amount,
    a filter coefficient being set based on a number frequency spectral signals in the frequency band, the processor performing the smoothing process using the filter coefficient set to each of the frequency bands.

2. The phase control signal generation device according to claim 1, wherein the processor is further configured to:
    store a weighting coefficient for each of the frequency bands; and
    the weighting coefficient corresponding to the frequency band for which the setting of the propagation delay time is changed,
    wherein the processor updates the phase control amount of the frequency band for which the propagation delay time is changed, based on the obtained weighting coefficient and the obtained difference.

3. The phase control signal generation device according to claim 2,
    wherein the obtained weighting coefficient has a first value around a center frequency of the frequency band for which the propagation delay time is changed by the processor and has a second value smaller than the first value in a neighboring frequency band adjacent to the frequency band for which the propagation delay time is changed by processor.

4. The phase control signal generation device according to claim 3,
    wherein the obtained weighting coefficient is attenuated from the frequency band for which the propagation delay time is changed by the processor to the neighboring frequency band such that the weighting coefficient is changed from the first value to the second value using a rectangular attenuation curve.

5. The phase control signal generation device according to claim 1,
    wherein the frequency band to be targeted for phase control has a band width which gets wider logarithmically from a low range to a high range.

6. The phase control signal generation device according to claim 1, wherein the processor is further configured to
    store a plurality of filter coefficients including a filter order and a cut-off frequency which are different between the frequency bands,
    the smoothing process being performed by using the filter coefficient which differs between the frequency bands.

7. The phase control signal generation device according to claim 6,
    wherein the filter order and the cut-off frequency are set based on a number frequency spectral signals in the frequency band.

8. The phase control signal generation device according to claim 6,
    wherein the filter coefficient is set such that as the frequency band becomes higher, a smoothing amount by the processor becomes greater.

9. A phase control signal generation method for generating a phase control signal for each of frequency bands for an audio signal converted into a frequency domain, the phase control signal generation method comprising:
    changing setting of a propagation delay time for each of predetermined frequency bands;
    obtaining a difference between propagation delay times before and after setting change;
    updating a phase control amount of the frequency band for which the propagation delay time is changed, based on the obtained difference;
    generating a phase control signal of each frequency band by performing a smoothing process for the phase control amount in a frequency domain using the updated phase control amount; and
    setting a filter coefficient based on a number frequency spectral signals in the frequency band, and performing the smoothing process using the filter coefficient set to each of the frequency bands.

10. The phase control signal generation method according to claim 9,
    further comprising obtaining, from weighting coefficients stored in a predetermined memory, a weighting coefficient corresponding to the frequency band for which the setting of the propagation delay time is changed,
    wherein, in the updating the phase control amount, the phase control amount of the frequency band for which the propagation delay time is changed is updated based on the obtained weighting coefficient and the obtained difference.

11. The phase control signal generation method according to claim 10,
    wherein the obtained weighting coefficient has a first value around a center frequency of the frequency band for which the propagation delay time is changed and has a second value smaller than the first value in a neighboring frequency band adjacent to the frequency band for which the propagation delay time is changed.

12. The phase control signal generation method according to claim 11,
wherein the obtained weighting coefficient is attenuated from the frequency band for which the propagation delay time is changed to the neighboring frequency band such that the weighting coefficient is changed from the first value to the second value using a rectangular attenuation curve.

13. The phase control signal generation method according to claim 9,
wherein the frequency band to be targeted for phase control has a band width which gets wider logarithmically from a low range to a high range.

14. The phase control signal generation method according to claim 9,
further comprising obtaining, from a plurality of filter coefficients including a filter order and a cut-off frequency which are different between the frequency bands, a filter coefficient corresponding to the frequency band for which the propagation delay time is changed,
wherein, in the generating the phase control signal, the phase control signal of each frequency band is generated by performing the smoothing process using the obtained filter coefficient.

15. The phase control signal generation method according to claim 14,
wherein the filter order and the cut-off frequency are set based on a number frequency spectral signals in the frequency band.

16. The phase control signal generation method according to claim 14,
wherein the filter coefficient is set such that as the frequency band becomes higher, a smoothing amount by the generating the phase control signal becomes greater.

17. A non-transitory computer readable medium having computer readable instruction stored thereon, which, when executed by a processor of a phase control signal generation device generating a phase control signal for each of frequency bands for an audio signal converted into a frequency domain, configures the processor to perform:
changing setting of a propagation delay time for each of predetermined frequency bands;
obtaining a difference between propagation delay times before and after setting change;
updating a phase control amount of the frequency band for which the propagation delay time is changed, based on the obtained difference;
generating a phase control signal of each frequency band by performing a smoothing process for the phase control amount in a frequency domain using the updated phase control amount; and
setting a filter coefficient based on a number frequency spectral signals in the frequency band, and performing the smoothing process using the filter coefficient set to each of the frequency bands.

* * * * *